(12) United States Patent
Sato (10) Patent No.: US 6,281,518 B1
(45) Date of Patent: Aug. 28, 2001

(54) LAYERED III-V SEMICONDUCTOR STRUCTURES AND LIGHT EMITTING DEVICES INCLUDING THE STRUCTURES

(75) Inventor: Shunichi Sato, Miyagi-ken (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 09/204,292

(22) Filed: Dec. 3, 1998

(30) Foreign Application Priority Data

Dec. 4, 1997 (JP) .................................................... 9-350071

(51) Int. Cl.$^7$ ........................ H01L 33/00; H01L 31/0304
(52) U.S. Cl. ................................ 257/13; 257/22; 257/97; 257/85; 372/45
(58) Field of Search ................................ 257/13, 22, 85, 257/97; 372/45

(56) References Cited

U.S. PATENT DOCUMENTS

| | | | |
|---|---|---|---|
| 5,960,018 | * | 9/1999 | Jewell ..................................... 372/96 |
| 5,978,398 | * | 11/1999 | Ramdani et al. ....................... 372/45 |
| 6,057,560 | * | 5/2000 | Uchida ................................... 257/94 |

OTHER PUBLICATIONS

Patent Abstract of Japan, No. 6-37355.
Kondow, et al., GaInNAs: A Novel Material for Long--Wavelength-Range Laser Diodes with Excellent High-Temperature Performance, J. Appl. Phys., vol. 35, (1996), pp. 1273–1275.

S. Sato, et al., "Room-temperature pulsed operation of 1.3 um GaInNAs/GaAs laser diode," Electronics Letters, vol. 33, No. 16, Jul. 31, 1997, pp. 1386–1387.

Patent Abstracts of Japan, Kokai No. 7-263744.

Larson et al "Photopumped Lasing . . . Lasers" *IEEE Photonics Tech. Lett.* vol. 9 No. 12. pp 1549–1551.*

* cited by examiner

*Primary Examiner*—Jerome Jackson, Jr.
(74) *Attorney, Agent, or Firm*—Dickstein Shapiro Morin & Oshinsky LLP (57) ABSTRACT

A layered structure of a III-V semiconductor alloy is disclosed, including N and at least one of the other group-V elements and a plurality of the group-III elements, capable of having an improved crystallinity, and of being grown with an arbitrary elemental composition together with a higher N content. The III-V semiconductor alloy is composed of $Ga_xIn_{1-x}N_yAs_{1-y}$ ($0<x<1$ and $0<y<1$) and the layered structure includes at least two kinds of monoatomic layers. The monoatomic layers each have a composition of $Ga_{x1}In_{1-x1}N_{y1}As_{1-y1}$, ($0<x1\leq1$ and $0<y1<1$) with either none or a first minimal In content, and of $Ga_{x2}In_{1-x2}N_{y2}As_{1-y2}$ ($0\leq x2<x1\leq1$ and $0<y2<1$) with either a second In content larger than the first In content, or none of Al or Ga content, respectively, and are deposited in a predetermined order, to thereby result in a superlattice structure which is considered to be a a semiconductor alloy layer having a deduced average composition.

20 Claims, 6 Drawing Sheets

LAYERED III-V SEMICONDUCTOR STRUCTURES AND LIGHT EMITTING DEVICES INCLUDING THE STRUCTURES

BACKGROUND OF THE INVENTION

1. Field of the Invention

This invention relates to layered semiconductor structures and more particularly, to layered III-V semiconductor structures with high nitrogen contents and to light emitting devices including the layered structures for use in laser diodes., photoreceptors and other similar devices.

2. Description of the Related Art

As communication systems have developed and both of desired and current information transmission rates have increased, more attention has been focused on the development of optical communication systems.

As presently contemplated, the optical communication system presently used in main communication lines will be extended to each subscriber's domestic line.

To implement such systems, it is indispensable to develop smaller and less expensive optical devices such as, among others, light emitting devices like laser diodes and light emitting diodes and photoreceptors.

For example, although light emitting devices such as laser diodes are conventionally accompanied by a cooling device such as a peltier element or heat sink so as to control the change in device temperatures caused by input currents, it is highly desirable to have stable laser diodes even without cooling devices in order to widely implement light emitting devices in the communication system.

Several semiconductor laser diodes have been proposed to attain improved temperature characteristics.

For example, a laser diode comprising a GaInNAs active layer disposed on a GaAs substrate has been disclosed in Japanese Laid-Open Patent Application No. 6-37355. In that disclosure, GaInAs layers having a lattice constant larger than that of GaAs have nitrogen (N) added to form GaInNAs layers with a decreased lattice constant, to thereby be lattice-matched to GaAs; and exhibit decreased bandgap energy. A result, light emissions at the wavelength region of 1.3 $\mu$m or 1.5 $\mu$m have become feasible in these devices. The GaInNAs layers were formed by metal organic chemical vapor deposition (MOCVD) using active N species.

As another example, calculated results of the energy level line-up are described by Kondow et al. in Japanese Journal of Applied Physics, Vol. 35 (1996), pages 1273–5, for a laser diode comprising a GaInNAs active layer formed on a GaAs substrate. It is described in the disclosure that, since the GaInNAs system is lattice-matched to GaAs, a large value of the conduction band discontinuity may be attained by providing cladding layers of AlGaAs rather than the materials which are lattice-matched to GaAs. This fabrication of laser diodes having improved temperature characteristics. This lattice matched GaInNAs system described just above was prepared by molecular beam epitaxy (MBE) using active N species.

As another example, according to Electronics Letters, Vol. 33, pages 1386–87, 1997, a GaInNAs laser device has been fabricated having laser emissions at 1.3 micron wavelength region. The GaInNAs system in this device was prepared by MOCVD using dimethylhydrazine (DMHy) as the nitrogen source.

In the aforementioned device fabrication methods, the growth of GaInNAs layers was carried out by continuously supplying the individual component materials Ga, In, N and As, simultaneously, to result in a constant composition throughout the thickness of the layers.

In the described GaInNAs semiconductor alloy systems, those in which N is included as a group-V element, mixed crystals are generally grown with a mixing ratio of the third additive element of only a few percent different than the stoichiometric compositions. The addition of a larger amount of the third element tends to deteriorate the quality of resulting crystals, and crystallinity of the GaInNAs layers therefore decreases with, for example increasing the percentage of N in the composition.

The inclusion of indium (In) in GaInNAs layers has been known to decrease band gap energies. Therefore, the amount of the N added also intended to decrease the band gap energies, may be decreased with an increase in the amount of In inclosed, which allows realization of laser emission in the region of 1.3 micron.

A composition described in Japanese Journal of Applied Physics, Vol. 35 (1996), pages 1273–5, has an amount of In as high as 30% which was added into GaInNAs layers to be formed with a crystallinity value as high as possible and to be used as a GaInNAs quantum well structure. In these layers, the N composition was only 0.5% and its emissions were at 1.2 micron. For the laser devices to be used in a communication system, the emission wavelengths are preferably about 1.3 micron, which requires that approximately 1% of N composition be achieved. It is noted that this 1% value for N is approximately one third of the N concentration value expected for layers containing 10% of In. Again, the N content required to achieve a desired emission wavelength can be decreased by incorporating an appropriate amount of In, which is advantageous without the deterioration of crystallinity which can be caused by the addition of larger amounts of N.

Since almost all nitrogen-containing alloy semiconductors are in the non-miscible region in the solid solubility diagram, the growth of these alloy semiconductors are generally quite difficult using conventional crystal growth methods. Therefore, only a minute amount of nitrogen can be incorporated in semiconductor crystals using non-equilibrium growth methods such as, for example, metal organic chemical vapor deposition (MOCVD) and molecular beam epitaxy (MBE).

For alloy semiconductors, in general, the non-miscibility increases with an increase in the number of constituent elements, and also toward the middle of the elemental composition. In other words, binary alloys can be grown most easily. This is also true for alloy semiconductors containing nitrogen as a group-V element. Alloys having an elemental composition closes to GaNAs can, therefore be grown with more ease within a GaInNAs alloy system.

The present inventor has grown GaInNAs alloy layers with varying In contents on a GaAs substrate by MOCVD, in which the source materials used were trimethylgallium (TMG), trimethylindium (TMI), arsine ($AsH_3$), and dimethylhydrazine (DMHy) as the nitrogen source, while hydrogen was used as a carrier gas. During the layer growth, the substrate temperature was at 630° C., and only the feeding rate of trimethylindium as the In source was varied.

GaInNAs alloy layers thus prepared were analyzed by secondary ion mass spectroscopy (SIMS) and the results on the N content are shown in Table 1 for the alloy layers various in In content percentages.

TABLE 1

| In content (%) | N content (%) |
|---|---|
| 7 | 2.5 |
| 13 | 1.7 |
| 23 | 0.5 |
| 28 | 0.3 |

The results in Table 1 indicates that the N content decreases with an increase in the In content. The N content in the GaInNAs alloy layers, which is necessary to bring about a certain emission wavelength, can therefore be decreased by the addition of In. However, it is known that the rate of N element to be included in the alloy system by conventional growth methods decreases with an increase in the In composition, and that crystallinity of the present GaInNAs system decreases with the increase in N composition with a greater rate with increasing the In composition.

Figure 1:
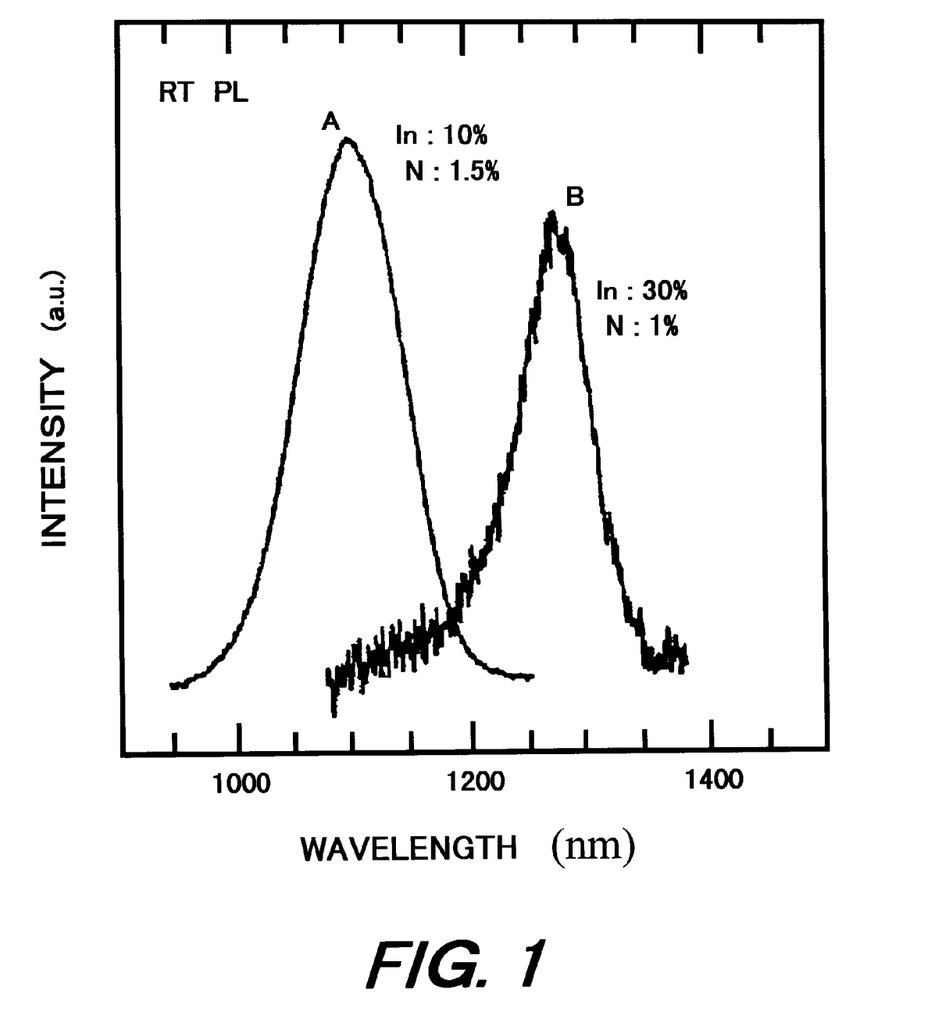
FIG. 1 shows photoluminescence spectra for a plurality of GaAs/GaInNAs/GaAs structures, in which the curves A and B are for the GaInNAs layers including In 10% and N 1.5%, and In 30% and N 1.0%, respectively.

FIG. 1 shows photoluminescence spectra for a plurality of GaAs/GaInNAs/GaAs structures, in which the curves A and B are for the GaInNAs layers with In 10% and N 1.5%, and In 30% and N 1.0%, respectively.

It is shown that photoluminescence intensity is stronger in the former (curve A) than the latter (curve B), despite the larger N content in the former. This can be considered, when the N content is approximately equal, the layer with a lower In content has a stronger photoluminescence intensity and also a higher crystallinity value, which may be related to the aforementioned miscibility gap for the semiconductor alloy systems.

In addition, a monoatomic superlattice structure has been proposed in Japanese Laid-Open Patent Application No.7-263744, to grow a semiconductor alloy having an N content higher than those formed by previous growth techniques. The monoatomic superlattice structure in the disclosure comprise a systematically layered structure with a first monoatomic layer including one of the group-III elements and one of the group-V elements other than N, and a second monoatomic layer including one of the group-III elements and N as the group-V elements.

For example, a "unit structure" is first constructed from eight monoatomic layers, in which six GaP first monoatomic layers and two GaN second monoatomic layers are accumulated in a predetermined order. Second, by systematically accumulating a plurality of the unit structure, a light emitting layer is formed.

The disclosure states that a superlattice structure can be formed having a bandgap energy approximately same as that of a GaNP mixed crystal, and that mixed crystals of GaNP and similar crystals can be formed having higher N contents, which have not been achieved through prior growth techniques.

Therefore, since some of the monoatomic layers of III-V semiconductor compound are used including only N as the group-V element in the above-mentioned disclosure in the Patent Application '744, layered mixed crystal structures can be formed having high N contents and also predetermined compositions with a N contents of 12.5, 25, 37.5, 50, 62.5, 75 or 75.5 percent.

However, there is a certain range of composition, which can not be achieved by this method. For example, in order to achieve an N content as low as 1%, a structure has to be constructed from 99 monoatomic layers without N as the group-V element and one monoatomic layer containing N. This results of a portion in the structure which is composed only of the III-V compound without any N content over a thickness of approximately 30 nanometer. The results in properties similar to bulk semiconductor materials rather than of the desired monoatomic superlattice structure having a single average composition. Therefore, the above-mentioned method is not satisfactory for growing semiconductor alloys having an arbitrary elemental composition.

SUMMARY OF THE INVENTION

Accordingly, it is an object of the present invention to provide improved layered semiconductor structures and light emitting semiconductor devices using the layered structures, having most, if not all, of the advantages and features of similar employed structures and devices, while eliminating many of the aforementioned disadvantages.

It is another object of the present invention to provide a layered structure of a III-V semiconductor alloy including N and at least one of the other group-V elements and a plurality of the group-III elements, capable of having a higher crystallinity, and of being grown with an arbitrary elemental composition together with a higher N content.

It is still another object of the present invention to provide a light emitting device having an improved light emitting efficiency, comprising the layered structure of the III-V semiconductor alloy.

In one embodiment of the preset invention, a layered structure of a III-V semiconductor alloy is provided, which is composed of $Ga_xIn_{1-x}N_yAs_{1-y}$ (0<x<1 (and 0<y<1) and includes N and at least one of the other group-v elements and a plurality of the group-III elements.)

The layered structure comprises at least two kinds of monoatomic layers, each including at least one of the group-III elements and one of the group-V elements, having a different content of the group-III elements, and being deposited in a predetermined order to form a superlattice structure.

The superlattice structure is formed by depositing in a predetermined order each of the at least two kinds of monoatomic layers, each having an elemental composition of $Ga_{x1}In_{1-x1}N_{y1}As_{1-y1}$ (0<x1<1 and 0<y1<1) (with either none or a minimal first In content), and of $Ga_{x2}In_{1-x2}N_{y2}As_{1-y2}$ (0≦x2<x1≦1 and 0<y2<1) with either a second In content larger than the first content, or none of the Ga content, respectively.

In another embodiment of the preset invention, a layered structure of a III-V semiconductor alloy is provided, which is composed of $(Al_xGa_{1-x})_y In_{1-y}N_zP_{1-z}$ (0≦x<1, 0<y<1 and 0<z<1), and includes N and at least one of the other group-V elements and a plurality of the group-III elements.

The layered structure comprises at least two kinds of monoatomic layers, each including at least one of the group-III elements and one of the group-V elements, having a different content of the group-III elements, and being deposited in a predetermined order to form a superlattice structure.

The superlattice structure is formed by depositing in a predetermined order each of the at least two kinds of monoatomic layers, each having an elemental composition of $(Al_xGa_{1-x})_{y1}In_{1-y1}N_{z1}P_{1-z1}$ (0≦x<1, 0<y1≦1 and 0<z1<1) with either none or a minimal first In content, and of $(Al_xGa_{1-x})_{y2} In_{1-y2}N_{z2}P_{1-z2}$ (0≦x≦1, 0<y2<y1≦1 and 0<z2<1) with either a second In content larger than the first content, or none of Al or Ga content, respectively.

In yet another embodiment of the preset invention, light emitting devices are fabricated, incorporating the layered structures of the III-V semiconductor alloy as active layers. With the present layer construction in the invention, the light emitting devices emit in either 1.3 micron or the visible wavelength region and exhibit an improved efficiency and lower threshold current values, which is desirable for use in lasers and photoreceptors for optical communication.

BRIEF DESCRIPTION OF THE DRAWINGS

The invention together with its various features and advantages, can be more easily understood from the following more detailed description taken in conjunction with the accompanying drawing in which.

DESCRIPTION OF THE ILLUSTRATIVE EMBODIMENTS

In the description which follows, specific embodiments of the invention particularly useful in light emitting device applications are described. It is understood, however, that the invention is not limited to these embodiments. For example, it is appreciated that layered structures in this invention are adaptable to any form of semiconductor devices. Other embodiments will be apparent to those skilled in the art.

In the present invention, a layered structure of a III-V semiconductor alloy is provided, including N and at least one of the other group-v elements such as, for example, and a plurality of the group-III elements such as, for example, Ga or In.

The layered structure comprises a plurality of monoatomic layers which are composed of the groups III and V elements mentioned just above. The plurality of monoatomic layers each have a different content of the group-III element and are deposited in a predetermined order to result in a superlattice structure (SL) which may be considered to be a semiconductor alloy layer with a "deduced" or average composition.

Since the layered structure comprises a plurality of monoatomic layers which are composed of the groups III and V elements and each layer has a different content of the group-III elements, the resulting layered structure can have approximately the same bandgap energy as that of the semiconductor alloy with a deduced average composition. In addition, since some of the monoatomic layers can be created with a higher N content, the resulting layered structure may be formed with relative ease to have enhanced layer properties such as, for example, crystallinity.

Figure 2:
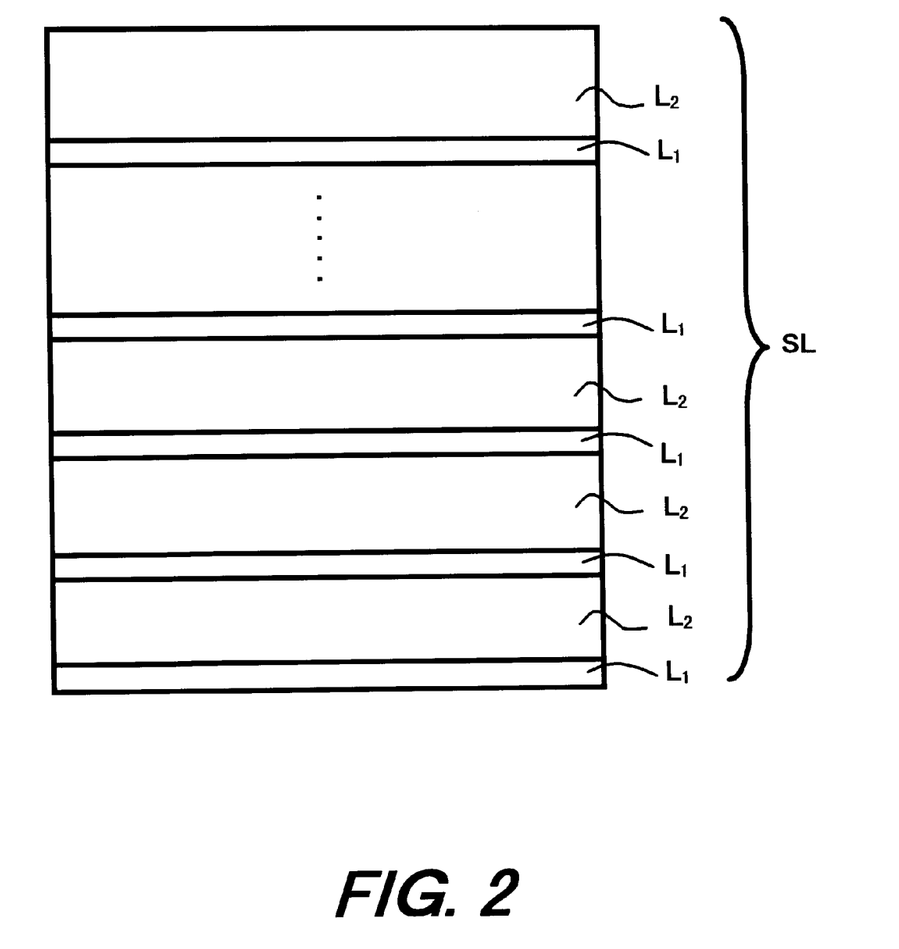
FIG. 2 is a cross-sectional view of a layered structure of a III-IV semiconductor alloy including a plurality of monoatomic layers $L_1$ and $L_2$ according to the present invention.

A layered structure of a III-V semiconductor alloy according to one embodiment of the present invention is shown in FIG. 2.

Referring to FIG. 2, the III-V semiconductor alloy is composed of $Ga_xIn_{1-x}N_yAs_{1-y}$ (0<x<1 and 0<y<1) and the layered structure includes a plurality of monoatomic layers $L_1$ and $L_2$.

The monoatomic layers each have an elemental composition of $Ga_xIn_{1-x1}N_{y1}As_{1-y1}$ (0<x1≦1 and 0<y1<1) with either none or a minimal first In content ($L_1$), and of $Ga_{x2}In_{1-x2}N_{y2}As_{1-y2}$ (0≦x2<x1≦1 and 0<y2<1) with either a second In content larger than the first content ($L_2$), or Ga content, respectively.

The monoatomic layers $L_1$ and $L_2$ are then deposited in a predetermined order to form a superlattice structure (SL) which can be considered to be a semiconductor alloy layer having a deduced average composition.

Since this layered structure comprises a plurality of monoatomic layers $L_1$ and $L_2$, the resulting layered structure can have approximately the same bandgap energy as that of the semiconductor alloy having the deduced average composition.

In addition, since the monoatomic layer $L_1$ can have a higher N content because of the lower In content, the resulting GaInNAs layered structure may be formed with relative ease to have better crystallinity. This is an improvement over III-V semiconductor alloy structures composed of a single deduced average composition throughout the layer structure.

Figure 3:
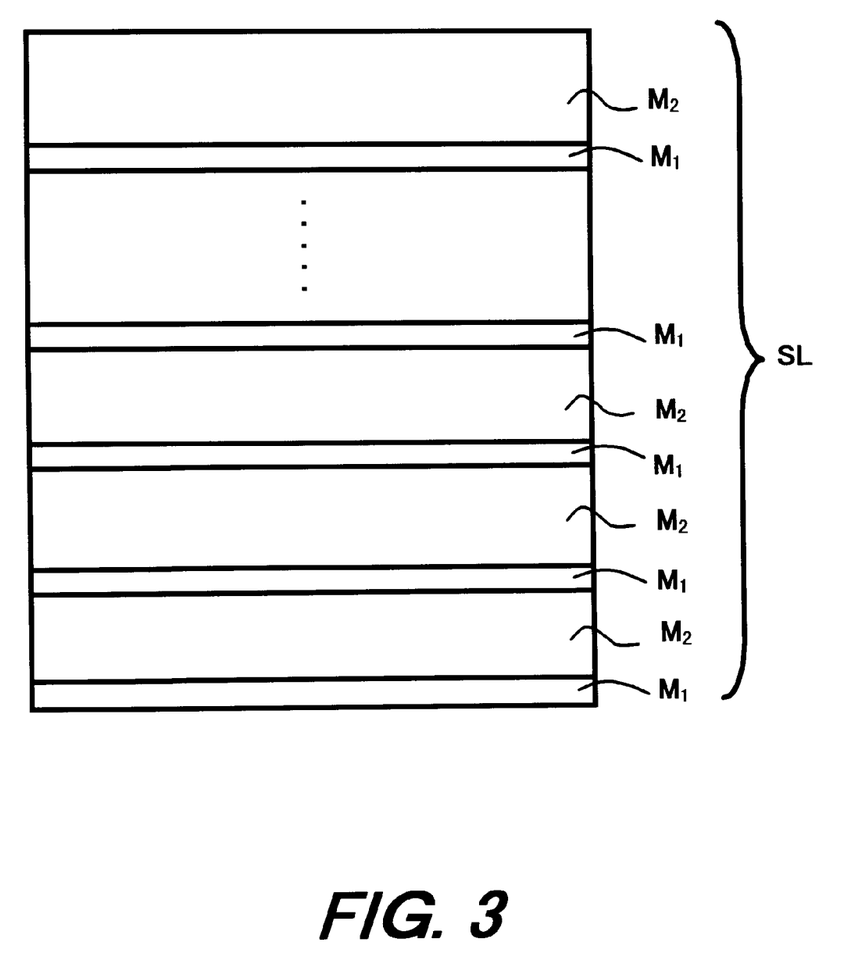
FIG. 3 is a cross-sectional view of another layered structure of a III-V semiconductor alloy including a plurality of monoatomic layers $M_1$ and $M_2$ according to the present invention.

A layered structure of a III-V semiconductor alloy according to another embodiment of the present invention is shown in FIG. 3.

Referring to FIG. 3, the III-V semiconductor alloy is composed of $(Al_xGa_{1-x})_yIn_{1-y}N_zP_{1-z}$ (0≦x≦1, 0<y<1 and 0<z<1) and the layered structure includes a plurality of monoatomic layers $M_1$ and $M_2$.

The monoatomic layers $M_1$ and $M_2$ each have an elemental composition of $(Al_xGa_{1-x})_{y1}In_{1-y1}N_{z1}P_{1-z1}$ (0≦x≦1, 0<y1<1 and 0<z1<1) with either none or a minimal first In content, and of $(Al_xGa_{1-x})_{y2}In_{1-y2}N_{z2}P_{1-z2}$ (0≦x≦1, 0≦y2<y1≦1 and 0<z2<1) with either a second In content larger than the first content, or none of Al or Ga content, respectively.

The monoatomic layers $M_1$ and $M_2$ are then deposited in a predetermined order, to form a superlattice structure which can be considered to be a semiconductor alloy layer having a deduced average composition.

Since this layered structure comprises a plurality of monoatomic layers $M_1$ and $M_2$, the resulting layered structure can have approximately the same bandgap energy as that of the semiconductor alloy having the deduced average composition.

In addition, since the monoatomic layer $M_1$ can have a higher N content because of the lower In content, the resulting (AlGa) InN P layered structure may be formed with relative ease to have better crystallinity. This is an improvement over III-V semiconductor alloy structures composed of the single deduced average composition throughout the layer structure.

In yet another embodiment of the preset invention, light emitting devices are fabricated incorporating either one of the previously described layered structures as an active layer, as shown in FIGS. 2 and 3.

As described earlier, since these layered structures comprise a plurality of monoatomic layers of III-V semiconductor alloy, the resulting layered structure can have approximately the same bandgap energy as that of the semiconductor alloy having the deduced average composition.

In addition, since the monoatomic layers may have a higher N content because of the aforementioned lower In content, the resulting GaInNAs layered structure may be formed with relative ease to have better crystallinity. This is an improvement over III-V semiconductor alloy structures composed of the single deduced average composition throughout the layer structure. (Therefore, the devices are capable of providing light emitting device having an improved efficiency and lower threshold current, which are desirable for use in lasers and photoreceptors for the optical communication.)

The following examples are provided to further to illustrate preferred embodiments of the invention. This invention is intended to be illustrative but not to be limited to the materials, processes or devices described herein.

EXAMPLES

Example 1

Figure 4:
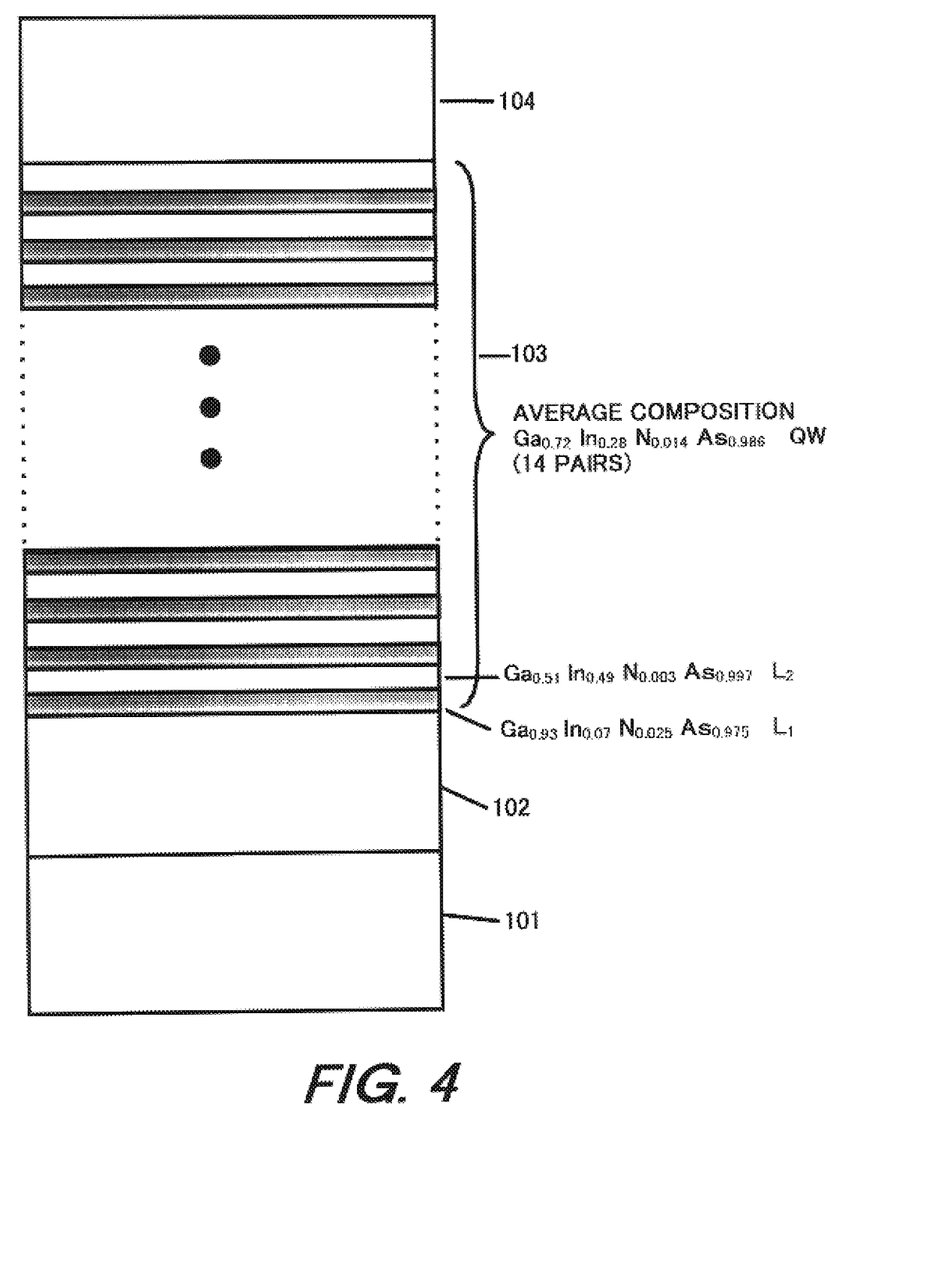
FIG. 4 is a cross sectional view of an illustrative embodiment of the light emitting device according to the present invention, in which a layered structure of the III-V semiconductor alloy is incorporated as an active layer.

A layered semiconductor structure according to the invention was fabricated as illustrated in FIG. 4.

The layered structure was grown by MOCVD, using the source materials such as trimethylgallium (TMG), trimethylindium (TMI), phosphine ($PH_3$), arsine ($AsH_3$) and dimethylhydrazine (DMHy) as the nitrogen source, while hydrogen was used as carrier gas.

Referring to FIG. 4, the layered structure comprises a GaAs substrate 101, a GaAs buffer layer 102 formed thereon, a quantum well layer 103 formed thereon with an average composition $Ga_{0.72}In_{0.28}N_{0.014}As_{0.986}$ having a thickness of 8 nanometers, and a GaAs capping layer 104 having a thickness 0.2 micron.

The quantum well layer 103 was formed of the contiguous monoatomic layers grown on the GaAs buffer layer 102 as follows: A first $Ga_{0.93}In_{0.07}N_{0.025}As_{0.975}$ monoatomic layer ($L_1$), a second $Ga_{0.51}In_{0.49}N_{0.003}As_{0.997}$ monoatomic layers ($L_2$), another layer $L_1$, yet another layer $L_2$ and so on, each repeatedly formed to total 14 $L_1$ and 14 $L_2$ layers.

The growths of the monoatomic layers $L_1$ and $L_2$ were carried out under similar conditions, with the exception that the supply ratio of the source materials was adjusted according to Table 1 to attain appropriate compositions of the group-III elements in respective layers. As an illustrative example, the monoatomic layers $L_1$ and $L_2$ were grown to give In 7% and N 2.5%, and In 49% and N 0.3%, respectively. The amount of the N content in the composition was, as described earlier considerably affected by the In composition.

Since a layered structure of multiple monoatomic semiconductor layers can be considered to be a single layer having a deduced average composition, the present quantum well layer may well be considered as a semiconductor layer composed of $Ga_{0.72}In_{0.28}N_{0.014}As_{0.986}$.

As the In composition in the growth of the present GaInNAs system is decreased, the rate of N element to be included in the alloy system increases, while the rate of the decrease in crystallinity with the addition of the element N tends to decrease. It is desirable, therefore, to attain a low In composition so that a high N composition is realized while retaining a sufficient crystallinity.

Since the average In composition was deduced to be 28%, the value of the N composition which corresponds to 28% In composition is only 0.3% as shown in Table 1, An N composition slightly higher than 0.3% (but not so much more) might be feasible at the expense of, for example, crystallinity.

Therefore, it is noted that a high average N composition was achieved in the superlattice structure of the present embodiment, wherein a the 1.4% N average composition was obtained, which is about 5 times the 0.3% N composition described above. In addition, this high N composition was achieved in low In composition layers, which is preferable for the inclusion of higher N composition.

Furthermore, a higher photoluminescence intensity was observed for the layered structure of the present than a structure which was separately grown with a uniform 28% In composition. This is due to the high N content achieved in the low In content layers, as described just above.

In addition, during the growth of the GaInNAs system, it was found that the N composition increased with an increases in the supply ratio of DMHy to $AsH_3$, (2) decreasing growth temperatures, or increasing growth rates.

Furthermore, since the layers $L_1$ and $L_2$ were each formed of alloy semiconductors, these layers are more desirable than binary compounds to form a semiconductor alloy of an arbitrary composition having a superlattice structure.

Example 2

Figure 5A:
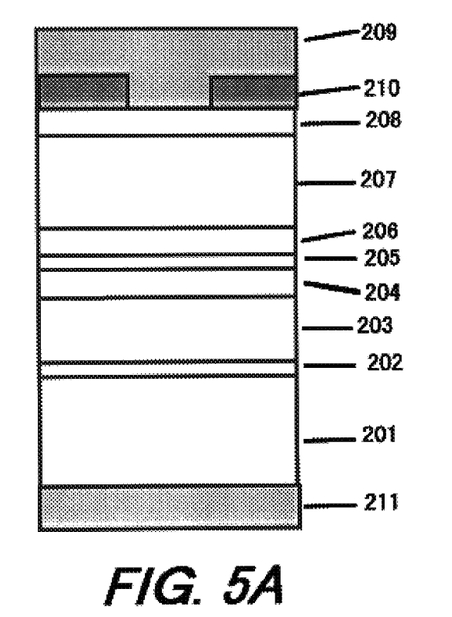
FIG. 5A is a cross sectional view of another illustrative embodiment of the light emitting device according to the present invention, in which another layered structure of the III-V semiconductor alloy is incorporated as an active layer.
Figure 5B:
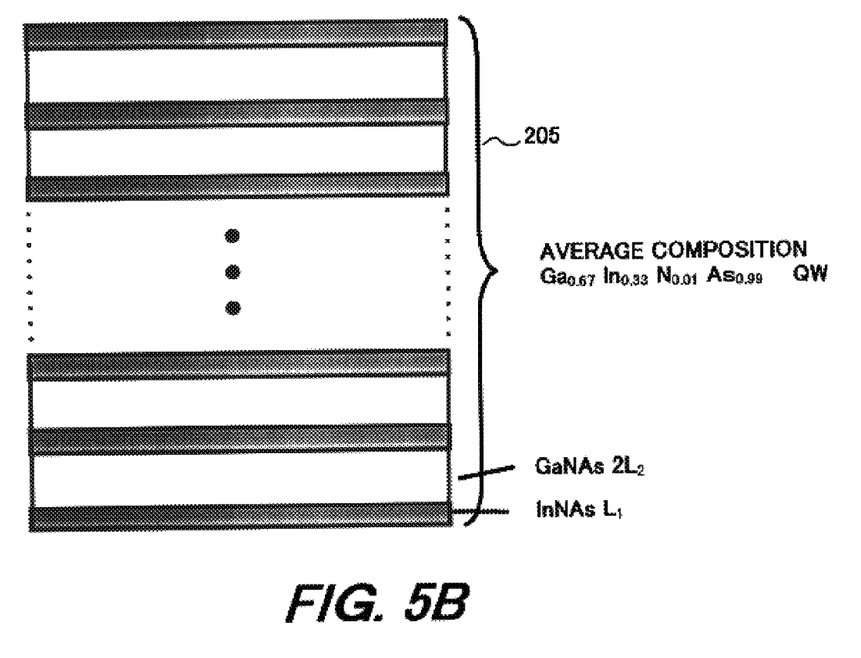
FIG. 5B is a cross sectional view of the active layer of FIG. 5A, in which a plurality of monoatomic layers $L_1$ and $L_2$ are accumulated in a predetermined order to form a superlattice structure.

A light emitting semiconductor device constructed according to the invention as shown in FIGS. 5A and 5B was fabricated, in which the device was a long wavelength laser comprising a GaInNAs quantum well structure formed on a GaAs substrate.

FIGS. 5A and 5B illustrate the light emitting device and a quantum well structure, respectively.

In the description which follows, the case of a basic structure such as a dielectric-stripe laser having an SCH-SQW (separate confinement hetero-structure with a single quantum well) structure will be and for the purpose of example.

The light emitting device was formed include layered sructures grown by MOCVD, using the source materials such as trimethylgallium (TMG), trimethylindium (TMI), phosphine ($PH_3$), arsine ($AsH_3$) and dimethylhydrazine (DMHy) as the nitrogen source, while hydrogen was used as carrier gas.

Referring to the FIGS. 5A and 5B, the light emitting semiconductor device comprised a GaAs substrate 201 with the following contiguous layers grown thereon, in the order recited:

An n-GaAs buffer layer 202, an n-$Ga_{0.5}In_{0.5}P$ lower cladding layer 203 with a thickness of 1.5 micron, an GaAs lower light guide layer 204 with a thickness of 100 nanometers, a quantum well layer 205 having a deduced average composition $Ga_{0.67}In_{0.33}N_{0.01}As_{0.99}$ with a thickness of 8 nanometers, a GaAs upper light guide layer 206 with a thickness of 100 nanometers, a p-$Al_{0.5}Ga_{0.5}As$ upper cladding layer 207 with a thickness of 1.5 micron, and a p-GaAs contact layer 208 with a thickness of 0.4 micron.

In addition, a dielectric layer 210 was disposed on the contact layer 208, a portion of which was removed to form a current inlet.

In addition, a positive electrode 209 was provided formed an ohmic contact with the contact layer 208 in the above-mentioned removed portion, and a negative electrode 211 on the rear side of the GaAs substrate 201.

The quantum well layer 205 was formed with the following contiguous monoatomic layers grown on the GaAs lower light guide layer 204 in the following order;

a first InNAs monoatomic layer ($L_1$), a pair of second GaNAs monoatomic layers ($2L_2$), another layer $L_1$, another pair of layer $L_2$ ($2L_2$) and, each repeatedly formed to total of 10 $L_1$ and 18 $L_2$ layers.

Since the layers $L_1$ and $L_2$ were each formed thin enough as a monoatomic layer, the quantum well layer 205 may be considered a single semiconductor layer, having a deduced average composition of $Ga_{0.67}In_{0.33}N_{0.01}As_{0.99}$.

As described earlier in Example 1, the rate of the N inclusion in the present GaInNAs system increases with a decrease in the In composition. Since the quantum well layer 205 comprised GaNAs monoatomic layers which had a higher rate of the N inclusion mentioned just above, a N composition was obtained which was higher than that of a single composition layer. Specifically, the desired semiconductor GaInNAs alloys may be formed with more ease by utilizing superlattice structures of component semiconductor materials such as GaNAs and other similar compounds.

In addition, since the crystallinity of GaInNAs alloys which have the same N concentration increases with decreasing In composition, the $Ga_{0.67}In_{0.33}N_{0.01}As_{0.99}$ layered structure formed in the present example has a crystallinity higher than a compound having a single composition layer. Therefore, since a higher N inclusion was achieved in the monoatomic layers which had a lower rate of decrease in crystallinity due to the N inclusion, the layered structure was formed having a high crystallinity value. This was evidenced by results from evaluation measurements of the layered quantum well structure 205, in which the structure had light emission at a wavelength of approximately 1.3 micron and a threshold current value lower than that in the single composition layer.

Example 3

Figure 6A:
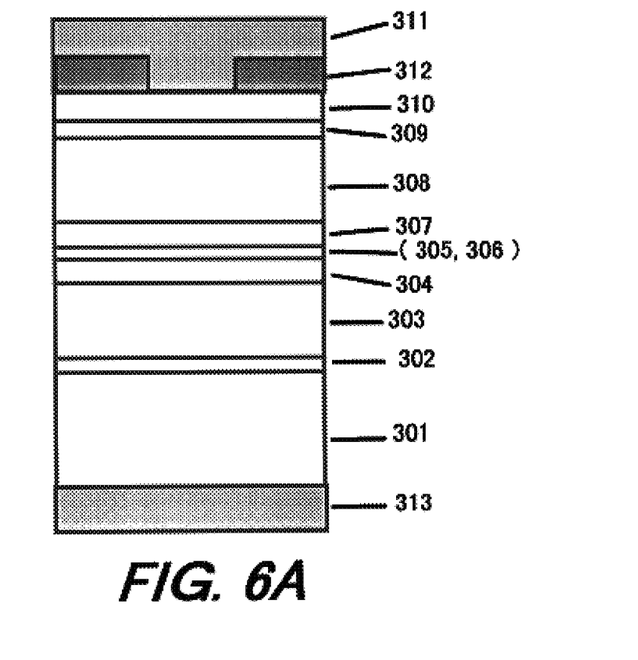
FIG. 6A is a cross sectional view of still another illustrative embodiment of the light emitting device according to the present invention, in which another layered structure of the III-V semiconductor alloy is incorporated as an active layer.
Figure 6B:
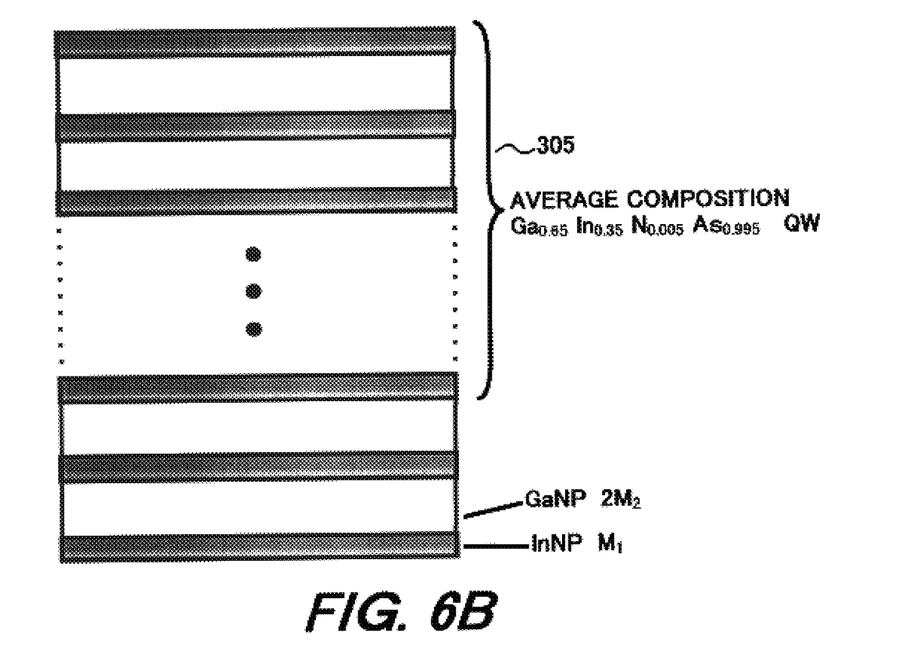
FIG. 6B is a cross sectional view of the active layer of FIG. 6A, in which a plurality of monoatomic layers $M_1$ and $M_2$ are accumulated in a predetermined order to form a superlattice structure.

A light emitting semiconductor device according to the invention as illustrated in FIGS. 6A and 6B was fabricated, in which the device was a laser device with shorter (or visible) wavelength region emissions, comprising a AlGaInNP quantum well structure formed on a GaAs substrate.

FIGS. 6A and 6B illustrate the light emitting device and the quantum well structure, respectively.

In the description which follows, there will be detailed the case of a basic structure using as a dielectric-stripe laser having an SCH-SQW (separate confinement hetero-structure with a single quantum well) structure for the purpose of example.

The light emitting device was formed including layered structures grown by MOCVD, using the source materials such as trimethylaluminum (TMA), trimethylgallium (TMG), trimethylindium (TMI), phosphine ($PH_3$), arsine ($AsH_3$) and dimethylhydrazine (DMHy) as the nitrogen source, while hydrogen was used as carrier gas.

Referring to the FIGS. 6A and 6B, the light emitting semiconductor device comprised a GaAs substrate 301 with the following contiguous layers grown thereon, in the order recited:

An n-GaAs buffer layer 302, an n-$(Al_{0.7}Ga_{0.3})_{0.5}In_{0.5}P$ lower cladding layer 303 with a thickness of 1.0 micron, an $(Al_{0.5}Ga_{0.5})_{0.5}In_{0.5}P$ lower light guide layer 304 with a thickness of 50 nanometers, three $Ga_{0.65}In_{0.35}N_{0.005}P_{0.995}$ quantum well layers 305 with a thickness of 7 nanometers and a tensile strain of 1%, two $(Al_{0.5}Ga_{0.5})_{0.5}In_{0.5}P$ upper light guide layer 306 with a thickness of 8 nanometers, an $(Al_{0.5}Ga_{0.5})_{0.5}In_{0.5}P$ upper light guide layer 307 with a thickness of 50 nanometers, a p-$(Al_{0.7}Ga_{0.3})_{0.5}In_{0.5}P$ upper cladding layer 308 with a thickness of 1.0 micron, a p-$Ga_{0.5}In_{0.5}P$ capping layer 309 with a thickness of 0.1 micron, and a p-GaAs contact layer 310 with a thickness of 0.4 micron.

In addition, a dielectric layer 312 was disposed on the contact layer 310, a portion of which was removed to form a current inlet.

Additionally provided for the device is a positive electrode 311 formed an ohmic contact with the contact layer 310 in the above-mentioned removed portion, and a negative electrode 313 on the rear side of the GaAs substrate 301.

The quantum well layer 305 was formed with the following contiguous monoatomic layers grown on the GaAs lower light guide layer 304 in the following order:

An InNP monoatomic layer ($M_1$), a pair of GaNP monoatomic layers ($2M_2$), another layer $M_1$, another pair of layer $M_2$ ($2M_2$) and so on, each repeatedly formed totaled 9 $M_1$ and 16 $M_2$ layers.

Since the layers $M_1$ and $M_2$ were each formed as a monoatomic layer, the quantum well layer 305 may be considered to be a single semiconductor layer, having a deduced average composition of $Ga_{0.65}In_{0.35}N_{0.005}P_{0.995}$.

As described earlier, the rate of the N inclusion in the present GaInNP system increases with a decrease in the In composition. Since the quantum well layer 305 comprises GaNP monoatomic layers which have a higher rate of the N inclusion an N composition was obtained which is higher than in a single composition layer. Therefore, the semiconductor GaInNP alloys may be formed with more ease by utilizing superlattice structures of component semiconductor materials such as GaNP and other similar compounds.

In addition, since the crystallinity of GaInNP alloys which had the same N concentration increases with decreasing In composition, the $Ga_{0.65}In_{0.35}N_{0.005}P0.995$ layered structure formed in the present example had a crystallinity higher than the compound with a single composition layer. Therefore, since a higher N inclusion was achieved in the monoatomic layers which had a lower rate of the decrease in crystallinity with the N inclusion, the layered structure was formed having a high crystallinity value. This was evidenced also by the results from evaluation measurements of the light emitting device using this quantum well structure 305, in which the structure had a threshold current value for the visible wavelength light emission lower than that in the single composition layer.

Although the layered structures have been described with respect to the GaInNP in this example, it may be noted that the further addition of Al to form AlGaInNP layers is advantageous for increasing bandgap energies, thereby resulting in smaller wavelength light emissions.

Furthermore, although the layered structures have been described specifically with respect to the GaInNAs and AlGaInNP compositions and their layered structures, it is to be understood that other compositions and layered structures may also be used to fabricate the semiconductor devices with similar device characteristics.

In addition, the light emitting devices in the present invention may be adopted not only to other light emitting devices such as semiconductor laser devices for use in light communication and optical writing, but also to light emitting diodes and photo-diodes for use in the infrared wavelength region.

This document claims priority and contains subject matter related to Japanese Patent Application 9-350071, filed with the Japanese Patent Office on Dec. 4, 1997, the entire contents of which are hereby incorporated by reference.

What is claimed is:

1. A III-V semiconductor alloy structure, said structure comprising:

first and second monoatoric layers, wherein each of said first and second monoatomic layers includes a group III-V semiconductor alloy containing nitrogen, at least one other group V element, and a group III element, said second monoatomic layer having a different content of said group III element from said first monoatomic layer, wherein the first and second monoatomic layers are formed by a metal organic chemical vapor deposition (MOCVD) method using an organic metal as a source material for the group-III element and an organic nitrogen compound as a source material for nitrogen; and a superlattice structure formed from the deposition of said first and second monoatomic layers in a predetermined order.

2. The III-V semiconductor alloy structure of claim 1, wherein said group III-V semiconductor alloy has a deduced composition of $Ga_xIn_{1-x}N_yAs_{1-y}$, where $0<x<1$ and $0<y<1$, and said first and second monoatomic layers have compositions of $Ga_{x1}In_{1-x1}N_{y1}As_{1-y1}$, where $0<x1<1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatomic layer, and wherein at least one each of said first and second monoatomic layers is deposited in a predetermined order to form said superlattice structure.

3. The III-V semiconductor alloy structure of claim 1, wherein said group III-V semiconductor alloy has a deduced composition of $(Al_xGa_{1-x})_yIn_{1-y}N_zP_{1-z}$, where $0\leq x\leq 1$, $0<y<1$, and $0<z<1$, and said first and second monoatomic layers have compositions of $(Al_xGa_{1-x})_{y1}In_{1-y1}N_{z1}P_{1-z1}$, where $0\leq x\leq 1$, $0<y1\leq 1$, and $0<z1<1$, and $(Al_xGa_{1-x})_{y2}In_{1-y2}N_{z2}P_{1-z2}$, where $0\leq x\leq 1$, $0\leq y2<y1\leq 1$, and $0<z2<1$, respectively, and wherein said first monoatomic layer has no or minimal In content and said second monoatomic layer has no Ga or Al content or an In content larger than said first monoatomic layer, and wherein at least one each of said first and second monoatomic layers is deposited in a predetermined order to form said superlattice structure.

4. A III-V semiconductor alloy structure, said structure comprising:

first and second monoatomic layers, wherein each of said first and second monoatomic layers includes a group III-V semiconductor alloy containing nitrogen, at least one other group V element, and a group III element, wherein the first and second monoatomic layers are formed by a metal organic chemical vapor deposition (MOCVD) method using an organic metal as a source material for the group-III element and an organic nitrogen compound as a source material for nitrogen, said group III-V semiconductor alloy having a deduced composition of $Ga_xIn_{1-x}N_yAs_{1-y}$, where $0<x<1$ and $0<y<1$;

said second monoatomic layer having a different content of both nitrogen and said group III element as compared with said first monoatomic layer, wherein said first and second monoatomic layers have compositions of $Ga_{x1}In_{1-x1}N_{y1}As_{1-y1}$, where $0<x1\leq 1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatomic layer; and a superlattice structure formed from the deposition of at least one each of said first and second monoatomic layers in a predetermined order.

5. A III-V semiconductor alloy structure, said structure comprising:

first and second monoatomic layers, wherein each of said first and second monoatomic layers includes a group III-V semiconductor alloy containing nitrogen, at least one other group V element, and a group III element, wherein the first and second monoatomic layers are formed by a metal organic chemical vapor deposition (MOCVD) method using an organic metal as a source material for the group-III element and an organic nitrogen compound as a source material for nitrogen, and wherein said group III-V semiconductor alloy has a deduced composition of $(Al_xGa_{1-x})_yIn_{1-y}N_zP_{1-z}$, where $0\leq x\leq 1$, $0<y<1$, and $0<z<1$;

said second monoatomic layer having a different content of both nitrogen and said group III element as compared with said first monoatomic layer, wherein said first and second monoatomic layers have compositions of $(Al_xGa_{1-x})_{y1}In_{1-y1}N_{z1}P_{1-z1}$, where $0\leq x\leq 1$, $0<y1\leq 1$, and $0<z1<1$, and $(Al_xGa_{1-x})_{y2}In_{1-y2}N_{z2}P_{1-z2}$, where $0\leq x>1$, $0\leq y2<y1\leq 1$, and $0<z2<1$, respectively, and wherein said first monoatomic layer has no or minimal In content and said second monoatomic layer has no Ga or Al content or an In content larger than said first monoatomic layer; and a superlattice structure formed from the deposition of at least one each of said first and second monoatoniic layers in a predetermined order.

6. A light emitting semiconductor device, said device comprising:

an active layer, said active layer further comprising a layered structure of a group III-V semiconductor alloy;

first and second monoatomic layers within said active layer, wherein each of said first and second monoatomic layers includes a group III-V semiconductor alloy containing nitrogen, at least one other group V element, and a group III element, said second monoatomic layer having a different content of said group III element from said first monoatomic layer, wherein the first and second monoatomic layers are formed by a metal organic chemical vapor deposition (MOCVD) method using an organic metal as a source material for the group-III element and an organic nitrogen compound as a source material for nitrogen; and a superlattice structure formed from the deposition of said first and second monoatomic layers in a predetermined order.

7. The device of claim 6, wherein said group III-V semiconductor alloy has a deduced composition of $Ga_xIn_{1-x}N_yAs_{1-y}$, where $0<x<1$ and $0<y<1$, and said first and second monoatomic layers have compositions of $Ga_{x1}In_{1-x1}N_{y1}As_{1-y1}$, where $0<x1\leq1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatomic layer, and wherein at least one each of said first and second monoatomic layers is deposited in a predetermined order to form said superlattice structure.

8. The device of claim 6, wherein said group III-V semiconductor alloy has a deduced composition of $(Al_xGa_{1-x})_yIn_{1-y}N_zP_{1-z}$, where $0\leq x\leq1$, $0<y<1$, and $0<z<1$, and said first and second monatonic layers have compositions of $(Al_xGa_{1-x})_{y1}In_{1-y1}N_{z1}P_{1-z1}$, where $0\leq x\leq1$, $0<y1\leq1$, and $0<z1<1$, and $(Al_xGa_{1-x})_{y2}In_{1-y2}N_{z2}P_{1-z2}$, where $0\leq x\leq1$, $0\leq y2<y1\leq1$, and $0<z2<1$, respectively, and wherein said first monoatomic layer has no or minimal In content and said second monoatomic layer has no Ga or Al content or an In content larger than said first monoatomic layer, and wherein at least one each of said first and second monoatomic layers is deposited in a predetermined order to form said superlattice structure.

9. A light emitting semiconductor device, said device comprising:

an active layer, said active layer further comprising a layered structure of a group III-V semiconductor alloy;

first and second monoatomic layers within said active layer, wherein each of said first and second monoatomic layers includes a group III-V semiconductor alloy containing nitrogen, at least one other group V element, and a group III element, wherein the first and second monoatomic layers are formed by a metal organic chemical vapor deposition (MOCVD) method using an organic metal as a source material for the group-III element and an organic nitrogen compound as a source material for nitrogen and wherein said group III-V semiconductor alloy has a deduced composition of $Ga_xIn_{1-x}N_yAs_{1-y}$, where $0<x<1$ and $0<y<1$, said second monoatornic layer having a different content of both nitrogen and said group III element as compared with said first monoatomic layer, wherein said first and second monoatomic layers have compositions of $Ga_{x1}In_{1-x1}N_{y1}As_{1-y1}$, where $0<x1\leq1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatomic layer; and a superlattice structure formed from the deposition of at least one each of said first and second monoatornic layers in a predetermined order.

10. A light emitting semiconductor device, said device comprising:

an active layer, said active layer further comprising a layered structure of a group III-V semiconductor alloy;

first and second monoatomic layers within said active layer, wherein each of said first and second monoatomic layers includes a group III-V semiconductor alloy containing nitrogen, at least one other group V element, and a group III element, wherein the first and second monoatomic layers are formed by a metal organic chemical vapor deposition (MOCVD) method using an organic metal as a source material for the group-III element and an organic nitrogen compound as a source material for nitrogen and said group III-V semiconductor alloy has a deduced composition of $(Al_xGa_{1-x})_yIn_{1-y}N_zP_{1-z}$, [,.], where $0\leq x\leq1$, $0<y<1$, and $0<z<1$, said second monoatomic layer having a different content of both nitrogen and said group III element as compared with said first monoatomic layer, wherein said first and second monoatomic layers have compositions of $(Al_xGa_{1-x})_{y1}In_{1-y1}N_{z1}P_{1-z1}$, where $0\leq x\leq1$, $0<y1\leq1$, and $0<z1<1$, and $(Al_xGa_{1-x})_{y2}In_{1-y2}N_{z2}P_{1-z2}$, where $0\leq x\leq1$, $0\leq y2<y1\leq1$, and $0<z2<1$, respectively, and wherein said first monoatomic layer has no or minimal In content and said second monoatomic layer has no Ga or Al content or an In content larger than said first monoatomic layer; and a superlattice structure formed from the deposition of at least one each of said first and second monoatomic layers in a predetermined order.

11. A III-V semiconductor alloy structure, said structure comprising:

first and second monoatomic layers, wherein each of said first and second monoatomic layers includes a group III-V semiconductor alloy containing nitrogen, at least one other group V element, and a group III element, said second monoatomic layer having a different content of said group III element from said first monoatomic layer, and wherein the In content of a given monoatomic layer is approximately inversely proportional to the nitrogen content of said given monoatomic layer; and a superlattice structure formed from the deposition of said first and second monoatomic layers in a predetermined order.

12. The III-V semiconductor alloy structure of claim 11, wherein said group III-V semiconductor alloy has a deduced composition of $Ga_xIn_{1-x}N_yAs_{1-y}$, where $0<x<1$ and $0<y<1$, and said first and second monoatomic layers have compositions of $Ga_{x1}In_{1-x1}N_{y1}As_{1-y1}$, where $0<x1\leq1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatomic layer, and wherein at least one each of said first and second monoatomic layers is deposited in a predetermined order to form said superlattice structure.

13. The III-V semiconductor alloy structure of claim 11, wherein said group III-V semiconductor alloy has a deduced composition of $(Al_xGa_{1-x})_yN_zP_{1-z}$, where $0\leq x<1$, $0<y<1$, and $0<z<1$, and said first and second monoatomic layers have compositions of $(Al_xGa_{1-x})_{y1}In_{1-y1}N_{z1}P_{1-z1}$, where $0\leq x\leq1$, $0<y1\leq1$, and $0<z1<1$, and $(Al_xGa_{1-x})_{y2}In_{1-y2}N_{z2}P_{1-z2}$, where $0\leq x\leq1$, $0\leq y2<y1\leq1$, and $0<z2<1$, respectively, and wherein said first monoatomic layer has no or minimal In content and said second monoatomic layer has no Ga or Al content or an In content larger than said first monoatomic layer, and wherein at least one each of said first and second monoatomic layers is deposited in a predetermined order to form said superlattice structure.

14. A III-V semiconductor alloy structure, said structure comprising:
   first and second monoatomic layers, wherein each of said first and second monoatomic layers includes a group III-V semiconductor alloy containing nitrogen, at least one other group V element, and a group III element, said group III-V semiconductor alloy having a deduced composition of $Ga_xIn_{1-x}N_yAs_{1-y}$, where $0<x<1$ and $0<y<1$;
   said second monoatomic layer having a different content of both nitrogen and said group III element as compared with said first monoatomic layer, wherein said first and second monoatomic layers have compositions of $Ga_{x1}In_{1-x1}N_{y1}As_{1-y1}$, where $0<x1\leq1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatoniic layer, and wherein the In content of a given monoatomic layer is approximately inversely proportional to the nitrogen content of said given monoatomic layer; and
   a superlattice structure formed from the deposition of at least one each of said first and second monoatomic layers in a predetermined order.

15. A III-V semiconductor alloy structure, said structure comprising:
   first and second monoatomic layers, wherein each of said first and second monoatomic layers includes a group III-V semiconductor alloy containing nitrogen, at least one other group V element, and a group III element, and wherein said group III-V semiconductor alloy has a deduced composition of $(Al_xGa_{1-x})_yIn_{1-y}N_zP_{1-z}$, where $0\leq x\leq 1$, $0<y<1$, and $0<z<1$;
   said second monoatomic layer having a different content of both nitrogen and said group III element as compared with said first monoatomic layer, wherein said first and second monoatomic layers have compositions of $(Al_xGa_{1-x})_{y1}In_{1-y1}N_{z1}P_{1-z1}$, where $0\leq x\leq 1$, $0<y1\leq 1$, and $0<z1<1$, and $(Al_xGa_{1-x})_{y2}In_{1-y2}N_{z2}P_{1-z2}$, where $0\leq x\leq 1$, $0\leq y2<y1\leq 1$, and $0<z2<1$, respectively, and wherein said first monoatomic layer has no or minimal In content and said second monoatomic layer has no Ga or Al content or an In content larger than said first monoatomic layer, and wherein the In content of a given monoatomic layer is approximately inversely proportional to the nitrogen content of said given monoatomic layer; and
   a superlattice structure formed from the deposition of at least one each of said first and second monoatomic layers in a predetermined order.

16. A light emitting semiconductor device, said device comprising:
   an active layer, said active layer further comprising a layered structure of a group III-V semiconductor alloy;
   first and second monoatomic layers within said active layer, wherein each of said first and second monoatomic layers includes a group III-V semiconductor alloy containing nitrogen, at least one other group V element, and a group III element, said second monoatomic layer having a different content of said group III element from said first monoatomic layer, and wherein the In content of a given monoatomic layer is approximately inversely proportional to the nitrogen content of said given monoatomic layer; and
   a superlattice structure formed from the deposition of said first and second monoatomic layers in a predetermined order.

17. The device of claim 16, wherein said group III-V semiconductor alloy has a deduced composition of $Ga_xIn_{1-x}N_yAs_{1-y}$, where $0<x<1$ and $0<y<1$, and said first and second monoatomic layers have compositions of $Ga_{x1}In_{1-x1}N_{y1}As_{1-y1}$, where $0<x1\leq1$ and $0<y1<1$, and $Ga_{x2}In_{1-x2}N_{y2}As_{1-y2}$, where $0\leq x2<1$ and $0<y2<1$, respectively, and wherein said first monoatomic layer has no or minimal In content and said second monoatomic layer has no Ga content or an In content larger than said first monoatomic layer, and wherein at least one each of said first and second monoatomic layers is deposited in a predetermined order to form said superlattice structure.

18. The device of claim 16, wherein said group III-V semiconductor alloy has a deduced composition of $(Al_xGa_{1-x})_yIn_{1-y}N_zP_{1-z}$, where $0\leq x\leq 1$, $0<y<1$, and $0<z<1$, and said first and second monoatomic layers have compositions of $(Al_xGa_{1-x})_{y1}In_{1-y1}N_{z1}P_{1-z1}$, where $0\leq x\leq 1$, $0<y1\leq 1$, and $0<z1<1$, and $(Al_xGa_{1-x})_{y2}In_{1-y2}N_{z2}P_{1-z2}$, where $0\leq x\leq 1$, $0\leq y2<y1\leq 1$, and $0<z2<1$, respectively, and wherein said first monoatomic layer has no or minimal In content and said second monoatomic layer has no Ga or Al content or an In content larger than said first monoatomic layer, and wherein at least one each of said first and second monoatomic layers is deposited in a predetermined order to form said superlattice structures.

19. A light emitting semiconductor device, said device comprising:
   an active layer, said active layer further comprising a layered structure of a group III-V semiconductor alloy;
   first and second monoatomic layers within said active layer, wherein each of said first and second monoatomic layers includes a group III-V semiconductor alloy containing nitrogen, at least one other group V element, and a group III element, and wherein said group III-V semiconductor alloy has a deduced composition of $Ga_xIn_{1-x}N_yAs_{1-y}$, where $0<x<1$ and $0<y<1$, said second monoatomic layer having a different content of both nitrogen and said group III element as compared with said first monoatomic layer, wherein said first and second monoatomic layers have compositions of $Ga_{x1}In_{1-x1}N_{y1}As_{1-y1}$, where $0<x1\leq1$ and $0<y1<-1$, and $Ga_{x2}In_{1-x2}N_{y2}As_{1-y2}$, where $0\leq x2<1$ and $0\leq y2<1$, respectively, and wherein said first monoatomic layer has no or minimal In content and said second monoatomic layer has no Ga content or an In content larger than said first monoatomic layer and wherein the In content of a given monoatomic layer is approximately inversely proportional to the nitrogen content of said given monoatomic layer; and
   a superlattice structure formed from the deposition of at least one each of said first and second monoatomic layers in a predetermined order.

20. A light emitting semiconductor device, said device comprising:
   an active layer, said active layer further comprising a layered structure of a group III-V semiconductor alloy;
   first and second monoatomic layers within said active layer, wherein each of said first and second monoatomic layers includes a group III-V semiconductor alloy containing nitrogen, at least one other group V element, and a group III element, and said group III-V semiconductor alloy has a deduced composition of $(Al_xGa_{1-x})_yIn_{1-y}N_zP_{1-z}$, where $0 \leq x \leq 1$ $0<y<1$, and $0<z<1$, said second monoatomic layer having a different content of both nitrogen and said group III element as compared with said first monoatomic layer, wherein said first and second monoatoric layers have compositions of $(Al_xGa_{1-x})_{y1}In_{y1}N_{z1}P_{1-z1}$, where $0<x<1$, $0<y1<1$, and $0<z1<1$, and $(Al_xGa_{1-x})_2In_{1-y2}N_{z2}P_{1-z2}$, where $0<x<1$, $0<y2<y1<1$, and $0<z2<1$, respectively, and wherein said first monoatomic layer has no or minimal In content and said second monoatomic layer has no Ga or Al content or an In content larger than said first monoatomic layer and wherein the In content of a given monoatomic layer is approximately inversely proportional to the nitrogen content of said given monoatomic layer; and a superlattice structure formed from the deposition of at least one each of said first and second monoatomic layers in a predetermined order.

* * * * *